United States Patent
Shu et al.

(10) Patent No.: US 10,276,374 B2
(45) Date of Patent: Apr. 30, 2019

(54) METHODS FOR FORMING FINS

(71) Applicant: GLOBALFOUNDRIES INC., Grand Cayman (KY)

(72) Inventors: Jiehui Shu, Clifton Park, NY (US); Garo J. Derderian, Saratoga Springs, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/709,730

(22) Filed: Sep. 20, 2017

(65) Prior Publication Data

US 2019/0088478 A1  Mar. 21, 2019

(51) Int. Cl.
*H01L 21/12* (2006.01)
*H01L 21/033* (2006.01)
*H01L 21/8234* (2006.01)
*H01L 27/06* (2006.01)
*H01L 27/092* (2006.01)
*H01L 29/66* (2006.01)
*H01L 21/8238* (2006.01)
*H01L 27/088* (2006.01)
*H01L 27/12* (2006.01)

(52) U.S. Cl.
CPC .. *H01L 21/0332* (2013.01); *H01L 21/823412* (2013.01); *H01L 21/823431* (2013.01); *H01L 21/823821* (2013.01); *H01L 27/0688* (2013.01); *H01L 27/0886* (2013.01); *H01L 27/0922* (2013.01); *H01L 27/1211* (2013.01); *H01L 29/6681* (2013.01)

(58) Field of Classification Search
CPC ......... H01L 21/0332; H01L 21/823412; H01L 21/823431; H01L 21/823821; H01L 27/0688; H01L 27/0886; H01L 27/0922; H01L 27/1211; H01L 29/6681
See application file for complete search history.

(56) References Cited

U.S. PATENT DOCUMENTS

2015/0056724 A1   2/2015  Shieh et al.

*Primary Examiner* — Hrayr A Sayadian
(74) *Attorney, Agent, or Firm* — Francois Pagette; Hoffman Warnick LLC

(57) ABSTRACT

The disclosure is directed to methods for forming a set of fins from a substrate. One embodiment of the disclosure includes: providing a stack over the substrate, the stack including a first oxide over the substrate, a first nitride over the pad oxide, a second oxide over the first nitride, and a first hardmask over the second oxide; patterning the first hard mask to form a first set of hardmask fins over the second oxide; oxidizing the first set of hardmask fins to convert the first set of hardmask fins into a set of oxide fins; using the set of oxide fins as a mask, etching the second oxide and the first nitride to expose portions of the first oxide thereunder such that remaining portions of the second oxide and the first nitride remain disposed beneath the set of oxide fins thereby defining a set of mask stacks; and using the set of mask stacks as a mask, etching the exposed portions of the first oxide and the substrate thereby forming the set of fins from the substrate.

10 Claims, 8 Drawing Sheets

METHODS FOR FORMING FINS

BACKGROUND

Technical Field

The present disclosure relates to methods for forming a set of fins from a substrate of an integrated circuit structure.

Related Art

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the goals of reducing transistor size while maintaining transistor performance. The FINFET is a non-planar, three dimensional transistor formed in a thin fin that extends upwardly from a semiconductor substrate. The semiconductor substrate may be a bulk silicon wafer from which the fin structures are formed or may be a silicon-on-insulator (SOI) wafer disposed on a support substrate. The SOI wafer includes a silicon oxide layer and a silicon-containing material layer overlying the silicon oxide layer. The fin structures are formed from the silicon-containing material layer. The fin structures are typically formed using conventional photolithographic or anisotropic etching processes (e.g., reactive ion etching (RIE) or the like).

Conventional processes for forming fins use film stacks over the substrate in order to aid in forming semiconductor fins. However, such processes suffer from poor margins caused by pitch walking. "Pitch walking" is a condition in which expected, periodic structures, e.g., fins, are constructed with unequal spacing and different periodicities. Therefore, forming hardmasks to form the fins from the substrate becomes difficult due to the varying spacing of the fins created within the film stacks. In addition, critical dimensions, e.g., widths, of the fins are also difficult to control due to pitch walking. As integrated circuits continue to scale down, e.g., 7 nanometer and beyond, space on the integrated circuit becomes more valuable and small changes in sizing of structures can greatly impact device performance.

SUMMARY

A first aspect of the disclosure is directed to a method for forming a set of fins from a substrate having a stack thereover, the stack including a first oxide over the substrate, a first nitride over the first oxide, a second oxide over the first nitride, and a first hardmask over the second oxide. The method may include: patterning the first hardmask to form a first set of hardmask fins over the second oxide; oxidizing the first set of hardmask fins to convert the first set of hardmask fins into a set of oxide fins; using the set of oxide fins as a mask, etching the second oxide and the first nitride to expose portions of the first oxide thereunder such that remaining portions of the second oxide and the first nitride remain disposed beneath the set of oxide fins thereby defining a set of mask stacks; and using the set of mask stacks as a mask, etching the exposed portions of the first oxide and the substrate thereby forming the set of fins from the substrate.

A second aspect of the disclosure is directed to a method for forming a set of fins from a substrate. The method may include: providing a stack over the substrate, the stack including a first oxide over the substrate, a first nitride over the pad oxide, a second oxide over the first nitride, and a first hardmask over the second oxide; patterning the first hard mask to form a first set of hardmask fins over the second oxide; oxidizing the first set of hardmask fins to convert the first set of hardmask fins into a set of oxide fins; using the set of oxide fins as a mask, etching the second oxide and the first nitride to expose portions of the first oxide thereunder such that remaining portions of the second oxide and the first nitride remain disposed beneath the set of oxide fins thereby defining a set of mask stacks; and using the set of mask stacks as a mask, etching the exposed portions of the first oxide and the substrate thereby forming the set of fins from the substrate The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

DETAILED DESCRIPTION

The present disclosure relates to methods for forming a set of fins from a substrate of an integrated circuit structure. The methods described herein result in reduced gouging of the substrate between adjacent fins without comprising the critical dimension of the fins. Specifically, the methods described herein include patterning a film stack to form hardmask fins with a small critical dimension to aid in the removal of unnecessary or unwanted hardmask fins. Specifically, the small critical dimension of the hardmask fins provides for a greater process margin, or more space between adjacent hardmask fins, thereby making easier to selectively remove unwanted hardmask fins. In addition, less substrate gouging at the final fin etch occurs because the process of performing the fin cut, or etching to remove undesired or inactive hardmask fins, is performed prior to the transferring of the hardmask pattern to the underlying layers within the film stack. In contrast, conventional processes include transferring hardmask patterns within underlying layers within a film stack prior to performing the fin cut (or the etching to remove the undesired or inactive hardmask fins). Further, the methods described herein include oxidizing portions of the hardmask in order to increase the critical dimension of the hardmask fins that is used to perform the final fin etch within the substrate. As a result, the semiconductor fins formed from the substrate have greater critical dimensions than those of conventional semiconductor fins.

Figure 1:
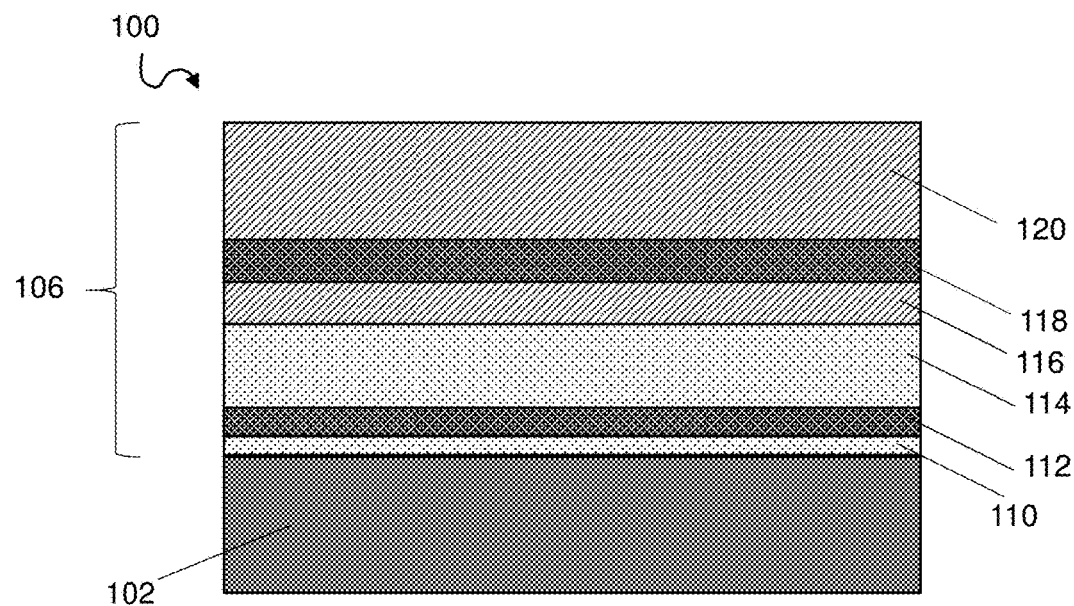
FIGS. 1-10 show cross-sectional views of an integrated circuit structure undergoing embodiments of a method according to the disclosure.

FIG. 1 shows a cross-sectional view of a preliminary integrated circuit (IC) structure according to embodiments of the disclosure. IC structure 100 may include a substrate 102. Substrate 102 may include any currently-known or later developed material capable of being processed into a transistor structure, and may include, e.g., a bulk semiconductor layer, a semiconductor-on-insulator (SOI) substrate, etc. Substrate 102 thus may overlie one or more other layers of material having distinct material and/or electrical properties, with such layers of material being omitted from the accompanying FIGS. to better illustrate structures and processes to form an IC structure according to the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained. Substrate 102 of IC structure 100 may be formed by forming a semiconductor material on an underlying structure (not shown). According to an example, substrate 102 can be formed by deposition and/or wafer bonding, e.g., separation by implantation of oxygen (SIMOX).

Substrate 102 may have a stack 106 thereover. Stack 106 may include a first oxide 110 over substrate 102, a first nitride 112 over first oxide 110, a second oxide 114 over first nitride 112, and a first hardmask 116 over second oxide 114. First oxide 110 may include, e.g., a thin pad oxide including silicon oxide. First nitride 112 may include, e.g., a thin pad nitride including silicon nitride. Second oxide 114 may include a furnace oxide including a medium temperature oxide, e.g., silicon oxide. First hard mask 116 may include, e.g., a polysilicon hardmask. In addition, stack 106 may also include a second hardmask 118 over first hardmask 116. Second hardmask 118 may include, e.g., silicon nitride. Further, stack 106 may include mandrel material 120, e.g., polysilicon, over second hardmask 118. Stack 106 may be formed over substrate 102 by conventional deposition techniques.

As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 2:
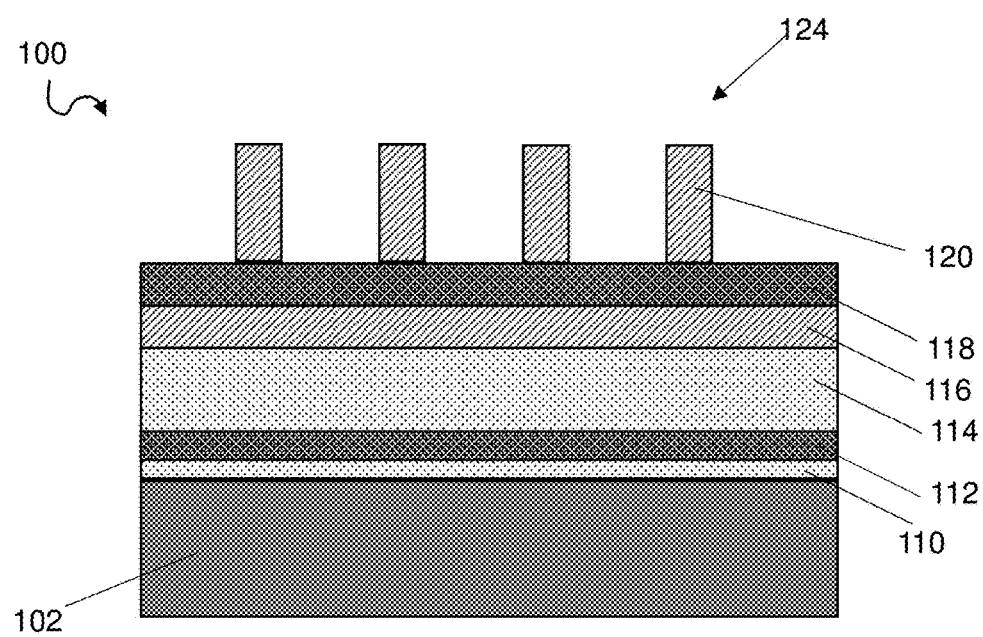
Figure 3:
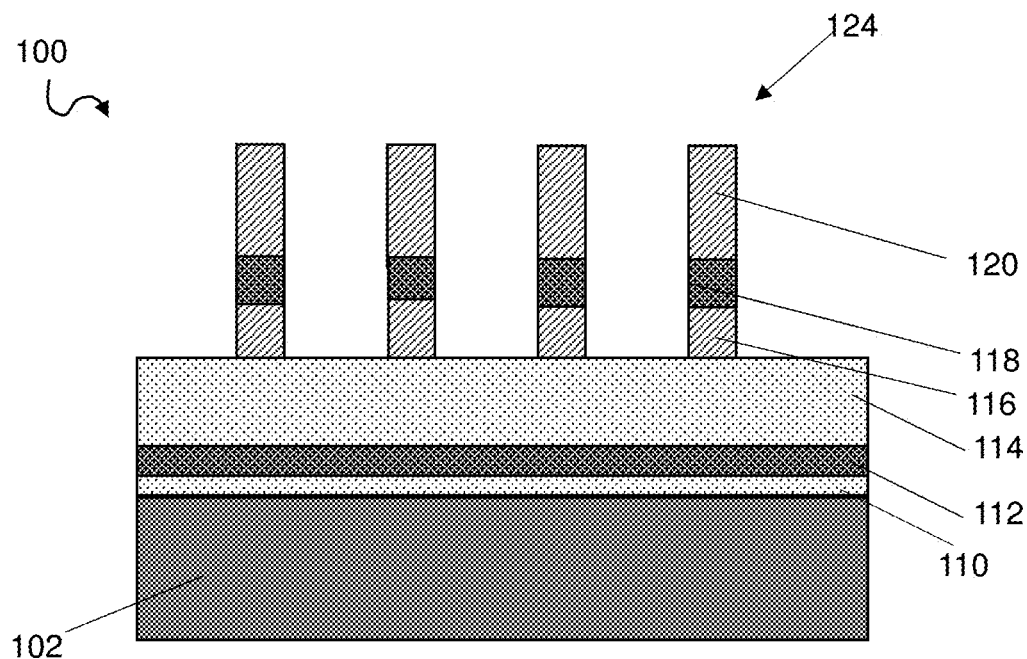
Figure 4:
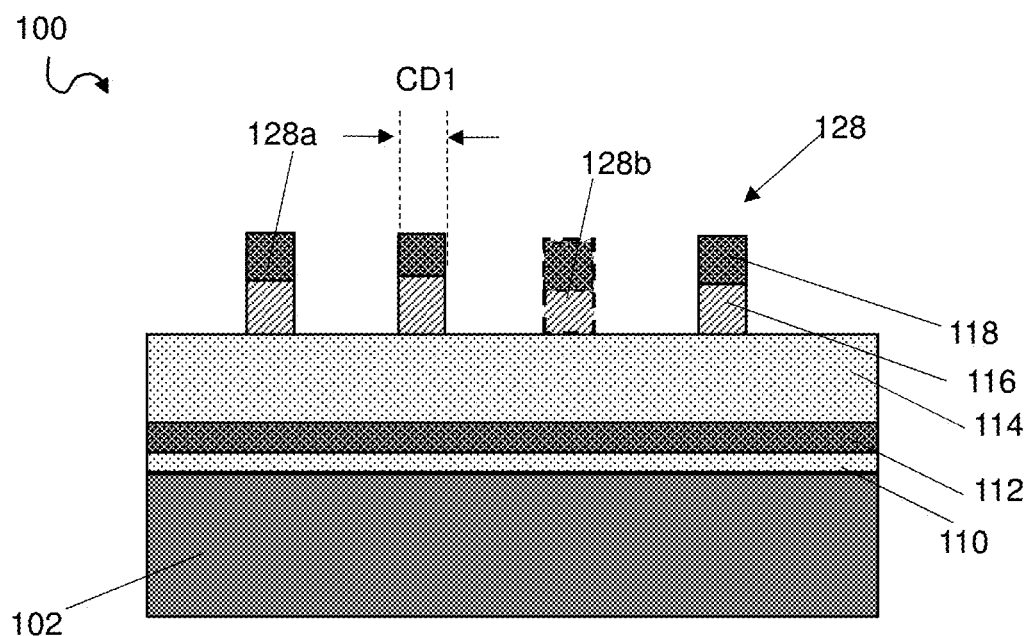
Figure 5:
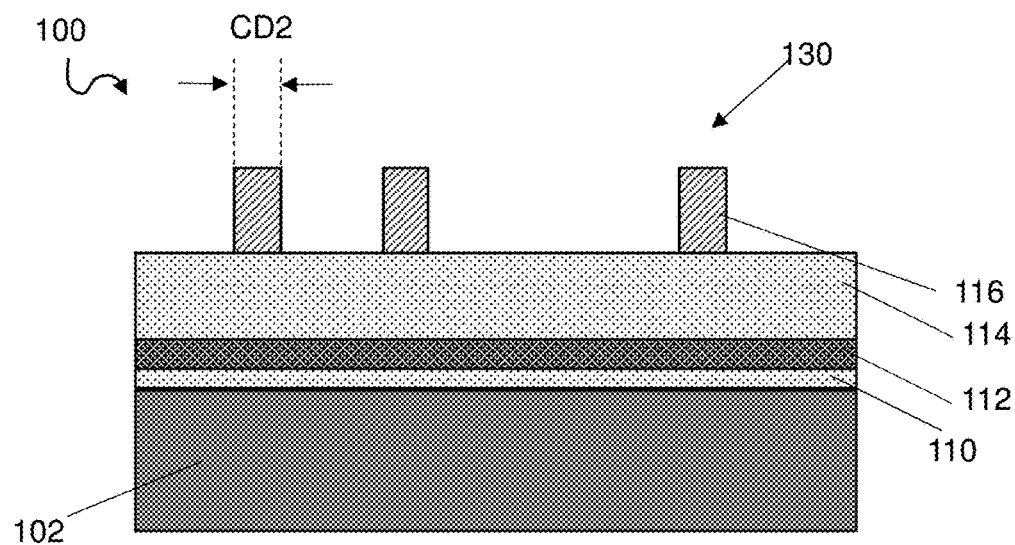

Turning now to FIGS. 2-5, the method according to embodiments of the disclosure may include patterning first hardmask 116 to form a first set of hardmask fins 130 (FIG. 5) over second oxide 114. The patterning of first hardmask 116 may include forming a mandrel pattern 124 from mandrel material 120 as is shown in FIG. 2. That is, mandrel material 120 may be patterned, e.g., by using a mask, and etched to form openings therein, thereby defining mandrel pattern 124. Mandrel pattern 124 may expose portions of second hardmask 118 which are desired to be removed. Portions of mandrel material 120 remain within mandrel pattern 124 over portions of second hardmask 118 which are used to form first set of hardmask fins 130 (FIG. 5).

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

As shown in FIG. 3, mandrel pattern 124 may be transferred into first and second hardmasks 116, 118 to expose portions of second oxide 114 thereunder. More specifically, exposed portions of second hardmask 118 and first hardmask 116 that are under the exposed portions of second hardmask 118 may be etched. Portions of second hardmask 118 and first hardmask 116 that are disposed beneath remaining mandrel material 120 of mandrel pattern 124 remains protected and thus unetched.

Turning now to FIG. 4, remaining mandrel material 120 of mandrel pattern 124 (FIG. 3) may be removed, e.g., by ashing, thereby defining a set of hardmask fins 128 over second oxide 114. Each hardmask fin in set of hardmask fins 128 may have a critical dimension (CD1) approximately equal to, for example, 2 to 10 nanometers. More specifically, CD1 may be approximately equal to 6 nanometers. Set of hardmask fins 128 may include wanted or active fins 128a and unwanted or inactive fins 128b. Active fins 128a are so named because such fins are to be used to define semiconductor fins from substrate 102 as will be described herein. Inactive fins 128b are so named because such fins are to be removed and will not be used to define semiconductor fins from substrate 102. Each hardmask fin 128a, 128b may include remaining portions of second hardmask 118 and first hardmask 116 that were protected by mandrel material 120. In addition, it may be desirable to remove inactive fins 128b (which is thus shown in phantom) from IC structure 100. Inactive fins 128b may be removed by conventional etching processes. The removal of inactive fins 128b may be accomplished with a mask (not shown) in place which protects active fins 128a during the removal of inactive fins 128b so that active fins 128a are not removed. It is to be understood the number and orientation of active fins 128a and inactive fins 128b are not limited to the embodiments shown in FIG. 4. Rather, the number and orientation of active fins 128a and inactive fins 128b may be determined by the integrated circuit fabricator and the final desired design of the semiconductor fins and/or IC structure. Turning now to FIG. 5, second hardmask 118 (FIG. 4) may be removed from over first hardmask 116 in set of hardmask fins 128 thereby defining set of hardmask fins 130 comprising only first hardmask 116. Each hardmask fin in set of hardmask fins 130 may have a critical dimension (CD2) approximately equal to, for example, 6 nanometers. That is, due to critical dimension CD2 of first hardmask 116 that defines hardmask fins 130 (as shown in FIG. 5) being formed from mandrel pattern 124 (FIG. 3), critical dimension CD2 of hardmask fins 130 is approximately equal to CD1 (FIG. 4) of hardmask fins 128.

Figure 6:
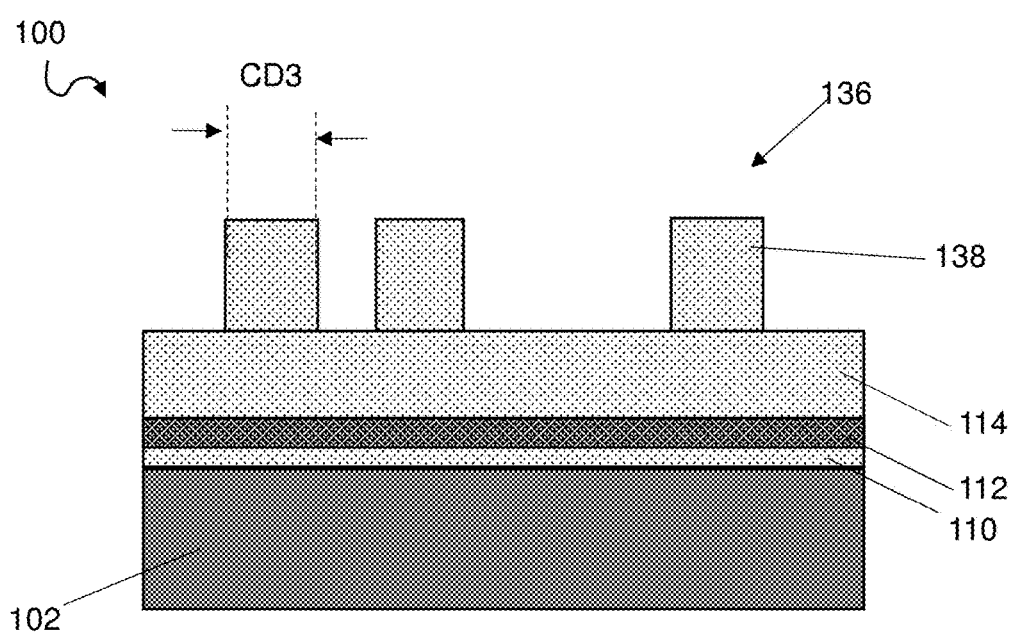

Each fin in set of hardmask fins 130 may be oxidized as shown in FIG. 6. More specifically, each fin in set of hardmask fins 130 may be oxidized to convert set of hardmask fins 130 into set of oxide fins 136. In one embodiment, a furnace steam oxidation process may be used to convert set of hardmask fins 130 to set of oxide fins 136. The furnace steam oxidation process may be performed at standard atmospheric pressure, at a temperature of, for example, approximately 400° C. to approximately 600° C., and may include an oxygen flow of, for example, approximately 3 standard liter per minute (SLM) to approximately 10 SLM and a hydrogen flow of, for example, approximately 5 SLM to approximately 15 SLM. In another embodiment, a rapid thermal process oxidation may be used to convert set of hardmask fins 130 to set of oxide fins 136. The rapid thermal process may be performed at a pressure of, for example, approximately 0 torr to approximately 5 torr, at a temperature of, for example, approximately 600° C. to approximately 1100° C., and may include an oxygen flow of, for example, approximately 15 SLM to approximately 25 SLM and a hydrogen flow of, for example, approximately 0.5 SLM to approximately 5 SLM. Either oxidation process may be performed, for example, for approximately 30 minutes to approximately 2 hours. However, other timing parameters can be used depending on the desired application of IC structure 100. The oxidation process may result in each oxide fin 138 in set of oxide fins 136 having a critical dimension CD3 that is approximately twice the critical dimension CD1 (FIG. 5) of each hardmask fin 130.

Figure 7:
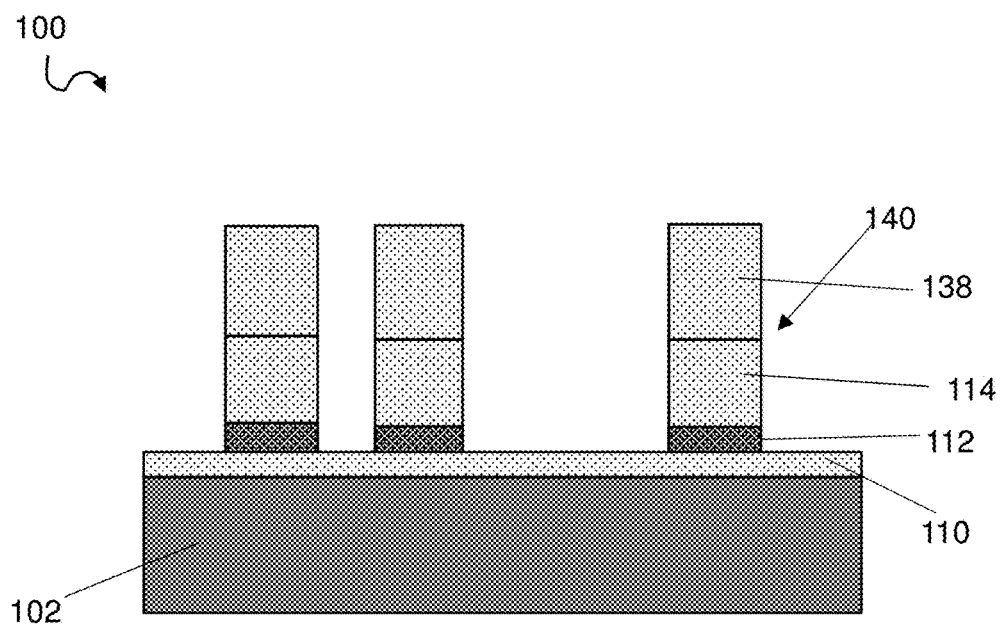
Figure 8:
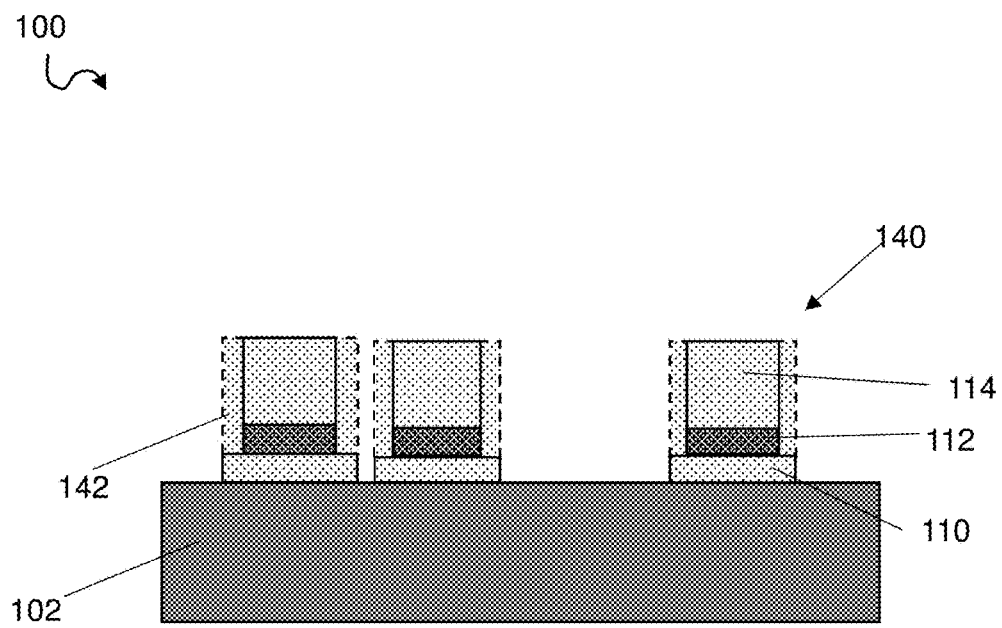

Turning now to FIG. 7, using set of oxide fins 136 (FIG. 6) as a mask, second oxide 114 and first nitride 112 may be etched to expose portions of first oxide 110 thereunder such that remaining portions of second oxide 114 and first nitride 112 remain disposed beneath set of oxide fins 136, thereby defining a set of mask stacks 140. That is, the pattern of set of oxide fins 136 may be transferring within underlying layers, e.g., second oxide, 114 and first nitride 112. Each mask stack 140 may include oxide fins 138 over remaining portions of second oxide 114 and first nitride 112. Further, as shown in FIG. 8, oxide fins 138 (FIG. 7) may be removed, e.g., by etching or ashing, and the exposed portions of first oxide 110 may be etched using set of mask stacks 140 as a mask. In some embodiments, it may be desirable to form an optional sidewall spacers 142 along sidewalls of mask stacks 140 to increase a critical dimension of mask stacks 140 thereby increasing the critical dimension of semiconductor fins formed from substrate 102. Sidewall spacers 142 may be formed by conventional deposition and etching techniques.

Sidewall spacers 142 may have a thickness, for example, of approximately 2 nanometers to 8 nanometers. More specifically, the thickness of sidewall spacers 142 may depend on the desired critical dimension of the finally formed semiconductor fins since sidewall spacers 142 together with mask stacks 140 may be used to define semiconductor fins as will be described herein.

Figure 9:
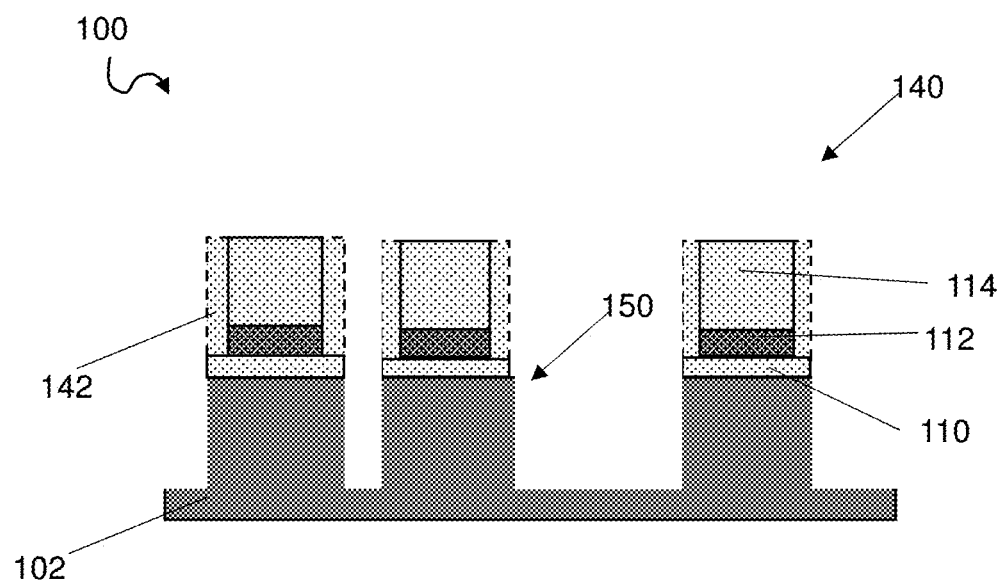
Figure 10:
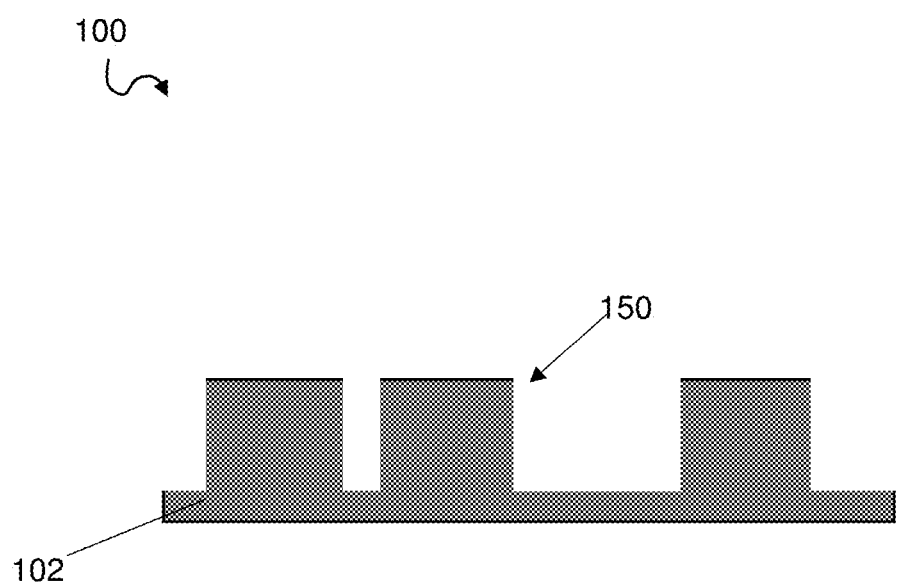

Turning now to FIG. 9, substrate 102 may be etched using mask stacks 140, having (optional sidewall spacers 142 and) first oxide 110 thereunder, as a mask thereby forming set of semiconductor fins 150 from substrate 102. Further, mask stacks 140 including any optional sidewall spacers 142 and first oxide 110 thereunder may be removed (e.g., by etching or ashing) such that set of semiconductor fins 150 remain as shown in FIG. 10. IC structure 100 may then undergo standard fin-shaped field effect transistor (FINFET) processing to form, e.g., sources/drains, gates, contacts, dielectric layers etc. And, so what? What's great about that process?

Figure 11:
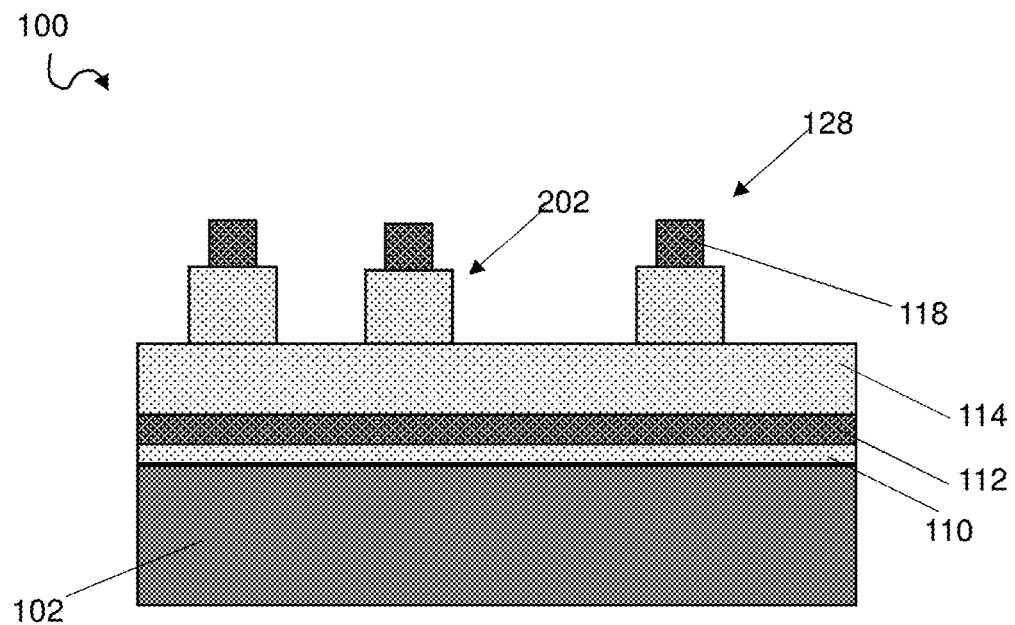
FIGS. 11-16 show cross-sectional views of an integrated circuit structure undergoing embodiments of another method according to the disclosure It is noted that the drawings of the disclosure are not to scale. The drawings are intended to depict only typical aspects of the disclosure, and therefore should not be considered as limiting the scope of the disclosure. In the drawings, like numbering represents like elements between the drawings.
Figure 12:
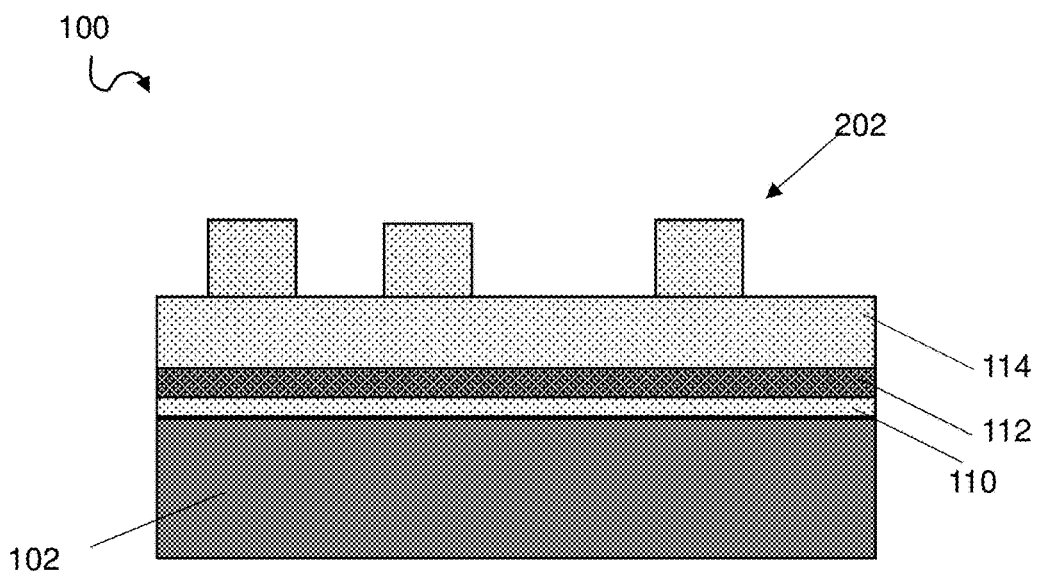

FIGS. 11-16 show cross-sectional views of IC structure 100 undergoing aspects of a method according to another embodiment of the disclosure. In this embodiment, after inactive fins 128b have been removed as was described relative to FIGS. 4-5, an oxidation process may be performed as was described relative to FIG. 6 to convert first hardmask 116 (FIG. 5) of set of hardmask fins 128 into set of oxide fins 202 having second hardmask 118 thereover. That is, in this embodiment, the oxidation process may be performed before the removal of second hardmask 118. Therefore, second hardmask 118 may remain over first hardmask 116 during the oxidation process. However, the oxidization process is performed such that first hardmask 116 is oxidized without oxidizing second hardmask 118. As disclosed herein, second hardmask 118 may include silicon nitride while first hardmask 116 may include polysilicon. Silicon nitride does not oxidize as easily as polysilicon during these oxidation processes. As a result, the silicon nitride of second hardmask 118 does not oxidize (or a negligible amount of oxidation may occur on the second hardmask 118) and the critical dimension of second hardmask 118 does not change. After set of oxide fins 202 is formed, second hardmask 118 may be removed, e.g., by etching or ashing, as shown in FIG. 11.

Figure 13:
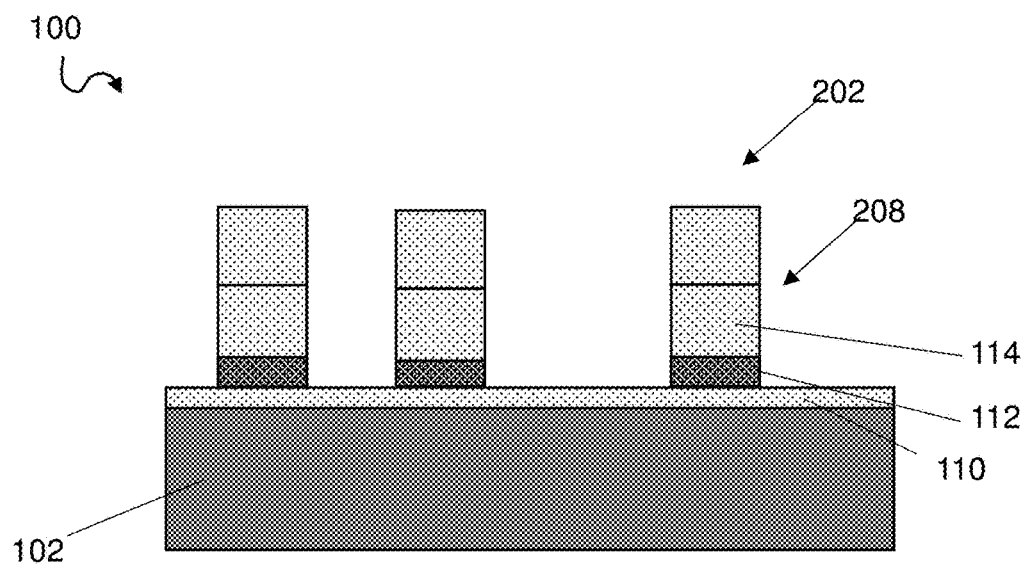
Figure 14:
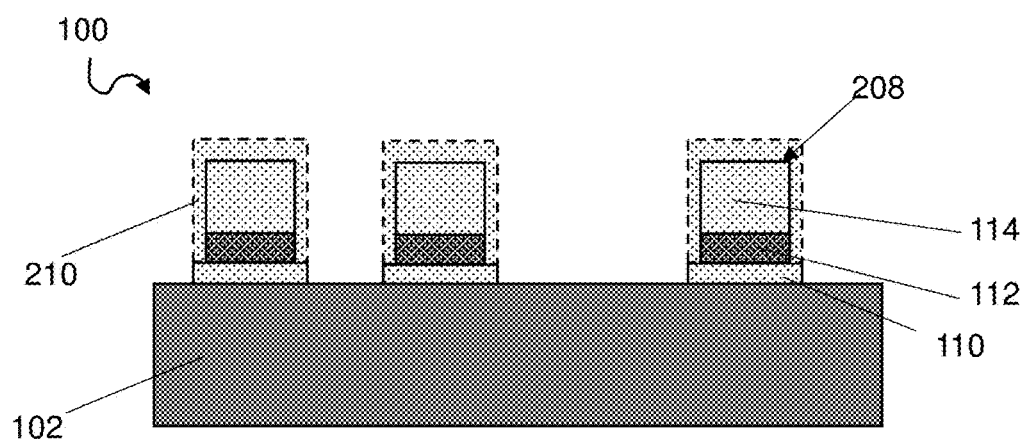

The method may continue as shown in FIGS. 12-16 as was described relative to FIGS. 7-10. That is, using set of oxide fins 202 as a mask, second oxide 114 and first nitride 112 may be etched to expose portions of first oxide 110 thereunder such that remaining portions of second oxide 114 and first nitride 112 remain disposed beneath set of oxide fins 202 thereby defining a set of mask stacks 208 (FIG. 13). Further, oxide fins 202 may be removed, e.g., by etching or ashing, and the exposed portions of first oxide 110 may be etched using set of mask stacks 208 as a mask (FIG. 14). In addition, optional sidewall spacers 210 may be formed as was described relative to FIG. 8.

Figure 15:
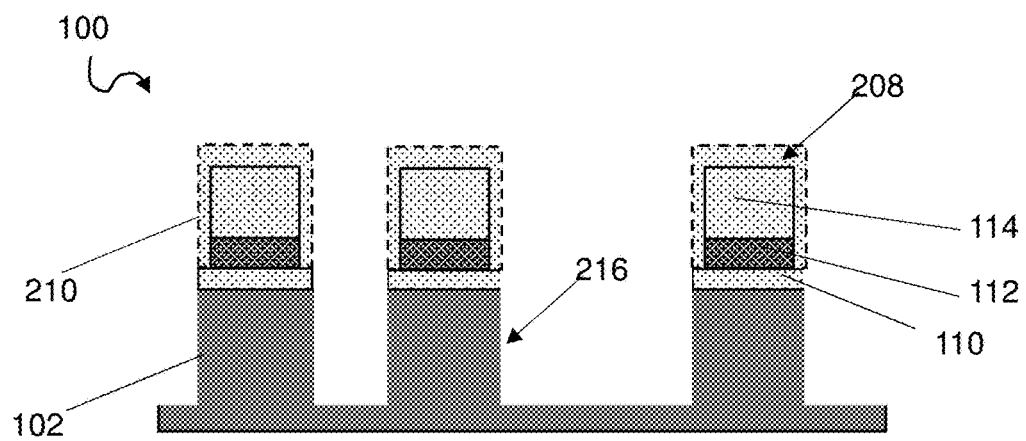
Figure 16:
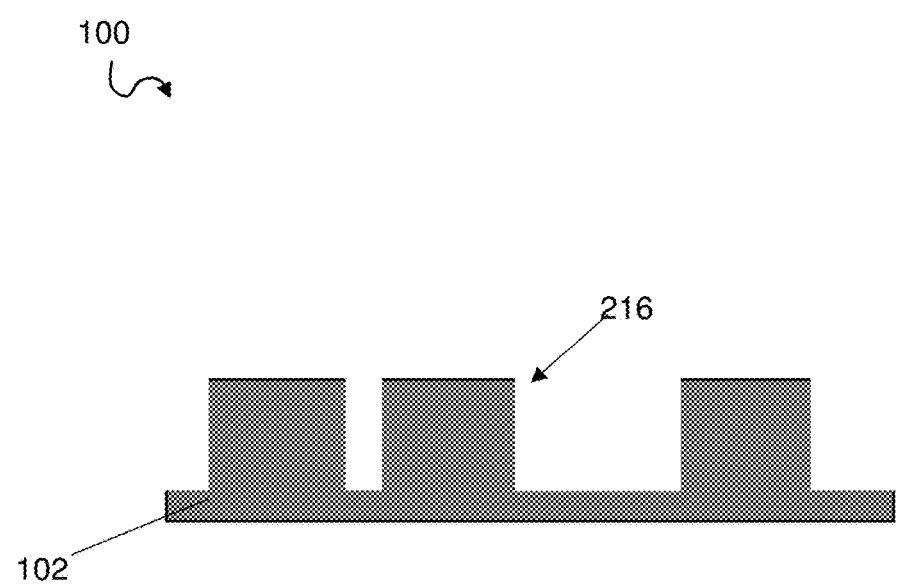

Turning now to FIG. 15, substrate 102 may be etched using mask stacks 208, having sidewall spacers 210 and first oxide 110 thereunder, forming set of semiconductor fins 216 from substrate 102. Further, mask stacks 208 including any optional sidewall spacers 142 and first oxide 110 thereunder may be removed, e.g., by etching or ashing, such that set of semiconductor fins 216 remain as shown in FIG. 16. IC structure 100 may then undergo standard fin-shaped field effect transistor (FINFET) processing to form, e.g., sources/drains, gates, contacts, dielectric layers etc.

The methods described herein result in less substrate gouging during the etching processes. That is, because the fin cutting, or the removal of unwanted or inactive hardmask fins occurs prior to the transferring of the hardmask fin pattern down to underlying layers within the stack, less gouging within the substrate occurs. In contrast to the methods described herein, conventional processes for forming semiconductor fins using a film stack includes transferring the hardmask fin pattern down to the underlying layers before performing the fin cut, or the removing the undesired or inactive hardmask fins. This results in gouging of the semiconductor substrate. However, since the methods described herein perform the fin cut earlier on in the fabrication scheme, less or no substrate gouging occurs.

In addition, the methods described herein result in forming semiconductor fins that have larger and more uniform critical dimensions than conventional semiconductor fin forming processes. In addition, because the hardmask fins, e.g., hardmask fins 130 (FIG. 5), have small critical dimensions (approximately 6 nm), the process margin for removing inactive fins, e.g., inactive fins 128b (as described relative to FIGS. 4-5), is better than in conventional IC structures. In addition, the subsequent oxidation of the hardmask fins increases the critical dimension of the hardmask fins such that the semiconductor fins cut from the substrate have a greater critical dimension than that of conventional IC structures.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the terms "first," "second," and the like, do not denote any order, quantity, or importance, but rather are used to distinguish one element from another. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method for forming a set of fins from a substrate, the method comprising:
    providing a stack over the substrate, the stack including a first oxide over the substrate, a first nitride over the first oxide, a second oxide over the first nitride, and a first hardmask over the second oxide
    patterning the first hardmask to form a first set of hardmask fins over the second oxide;
    oxidizing the first set of hardmask fins to convert the first set of hardmask fins into a set of oxide fins;
    using the set of oxide fins as a mask, etching the second oxide and the first nitride to expose portions of the first oxide thereunder such that remaining portions of the second oxide and the first nitride remain disposed beneath the set of oxide fins thereby defining a set of mask stacks; and
    using the set of mask stacks as a mask, etching the exposed portions of the first oxide and the substrate thereby forming the set of fins from the substrate.

2. The method of claim 1, wherein the stack further includes a second hardmask over the first hardmask and a mandrel pattern over the second hardmask, wherein the patterning of the first hardmask includes:
    transferring the mandrel pattern into the first and second hardmask to expose portions of the second oxide thereunder;
    removing the mandrel pattern thereby defining a second set of hardmask fins over remaining portions of the second oxide, the second set of hardmask fins including remaining portions of the second hardmask over the first hardmask;
    removing any hardmask fin from the second set of hardmask fins not defined by the first set of hardmask fins; and
    removing the second hardmask from over the first hardmask in each hardmask fin of the second set of hardmask fins thereby defining the first set of hardmask fins.

3. The method of claim 1, wherein the stack further includes a second hardmask over the first hardmask and a mandrel pattern over the second hardmask, wherein the patterning of the first hardmask includes:
- transferring the mandrel pattern into the first and second hardmask to expose the second oxide thereunder;
- removing the mandrel pattern thereby defining the first set of hardmask fins over remaining portions of the second oxide, the first set of hardmask fins including remaining portions of the second hardmask over the first hardmask; and
- removing at least one hardmask fin from the first set of hardmask fins.

4. The method of claim 3, wherein the oxidizing of the first set of hardmask fins includes oxidizing the first hardmask without oxidizing the second hardmask of each hardmask fin such that the second hardmask is disposed over each oxide fin in the set of oxide fins.

5. The method of claim 4, further comprising:
- removing the second hardmask from over each oxide fin in the set of oxide fins.

6. The method of claim 5, wherein the first hardmask includes polysilicon and the second hardmask includes silicon nitride.

7. The method of claim 1, further comprising:
- forming spacers on opposing sidewalls of each mask stack in the set of mask stacks, wherein the etching of the exposed portions of the first oxide and the substrate to form the set of fins from the substrate includes using each mask stack together with the spacers as a mask.

8. The method of claim 1, wherein a width of each hardmask fin in the first set of hardmask fins is approximately equal to 6 nanometers.

9. The method of claim 1, wherein a width of each oxide fin in the set of oxide fins includes a critical dimension of about two times the width of each hardmask fin in the first set of hardmask fins.

10. The method of claim 1, wherein the oxidizing the first set of hardmask fins includes performing a furnace steam oxidation or a rapid thermal process oxidation.

\* \* \* \* \*